United States Patent
Mayusumi et al.

(10) Patent No.: US 6,578,589 B1
(45) Date of Patent: Jun. 17, 2003

(54) APPARATUS FOR MANUFACTURING SEMICONDUCTOR WAFER

(75) Inventors: Masanori Mayusumi, Gumma (JP); Masato Imai, Gumma (JP); Kazutoshi Inoue, Gumma (JP); Shinji Nakahara, Gumma (JP); Shintoshi Gima, Gumma (JP)

(73) Assignee: Super Silicon Crystal Research Institute Corp., Annaka (JP)

( * ) Notice: Subject to any disclaimer, the term of this patent is extended or adjusted under 35 U.S.C. 154(b) by 0 days.

(21) Appl. No.: 09/937,525

(22) PCT Filed: Mar. 31, 2000

(86) PCT No.: PCT/JP00/02094
§ 371 (c)(1),
(2), (4) Date: Sep. 24, 2001

(87) PCT Pub. No.: WO00/59017
PCT Pub. Date: Oct. 5, 2000

(30) Foreign Application Priority Data

Mar. 31, 1999 (JP) .......................................... 11-091306

(51) Int. Cl.$^7$ ................................................ B08B 7/04
(52) U.S. Cl. ........................................ 134/61; 134/902
(58) Field of Search ................... 134/902, 61, 64 R, 134/66, 71

(56) References Cited

U.S. PATENT DOCUMENTS 3,734,109 A * 5/1973 Hebner ..................... 134/64 R
4,949,669 A * 8/1990 Ishii et al. ................... 118/719

FOREIGN PATENT DOCUMENTS

| JP | 60-154531 A | 8/1985 |
| JP | 3-82123 A | 4/1991 |
| JP | 5-259146 A | 10/1993 |
| JP | 9-148297 A | 6/1997 |

\* cited by examiner

Primary Examiner—Philip R. Coe
(74) Attorney, Agent, or Firm—Frishauf, Holtz, Goodman & Chick, P.C.

(57) ABSTRACT

Disclosed is a compact apparatus for manufacturing semiconductor wafers, which is aimed at complete removing of moisture from the wafers after final cleaning while reducing the manufacturing time. The apparatus includes a cleaning chamber (1) for final cleaning, a storage chamber (3) for storing wafers, a transfer chamber (2) communicating with the both cleaning and storage chambers (1, 3), and formed in its upper wall with a heat-conducting window (7), a robot hand (5) and a robot arm (4) for transporting the wafer (W) from the cleaning chamber (1) to the storage chamber (3) within the transfer chamber, infrared lamps (6) arranged to face the window (7) outside the transfer chamber (2) so as to heat the wafer (W) in the course of transportation within the transfer chamber, gas supply ports (8) for producing a laminar flow of inert gas from the storage chamber (3) to the cleaning chamber (1) to expose wafers (W) with the gas, and exhaust ports (9) for exhausting the moisture removed from wafers.

3 Claims, 2 Drawing Sheets

US 6,578,589 B1

APPARATUS FOR MANUFACTURING SEMICONDUCTOR WAFER

This application is a U.S. National Phase Application under 35 USC 371 of International Application PCT/JP00/02094 (not published in English) filed Mar. 31, 2000.

TECHNICAL FIELD

The present invention relates in general to an apparatus for manufacturing a semiconductor wafer, and more particularly to an apparatus for performing a drying processing on a semiconductor wafer substrate in course of transfer, specially on the wafer substrate after the completion of a final cleaning processing.

BACKGROUND ART

In the semiconductor wafer manufacturing process, during the processing prior to a transfer to a heat treatment processing or an epitaxial growth processing of a semiconductor wafer, the wafer is subjected to a final cleaning processing by a wet cleaning such as the RCA cleaning method so as to remove particles, metal impurities, organic materials, natural oxide films, etc., and thereby clean the wafer.

However, a large quantity of cleaning water is used in the final cleaning processing so that water drops are deposited on the wafer surface after the completion of the final cleaning processing. If the wafer is left to stand without removing such deposited moisture, spot-like smears called as water marks are produced on the wafer surface and these smears tend to cause crystal defects in the semiconductor wafer, deterioration in the film quality of an epitaxial film or the like in the following processing step such as a heat treatment or an epitaxial growth processing. Thus, it has been the common practice to dry the wafer to remove the deposited water after the completion of the final cleaning processing of the wafer.

Drying methods well-known for such wafers include, for example, the spin drying method in which after the completion of the final cleaning processing the wafer is rotated at a high speed for a given time in the cleaning chamber to forcibly scatter and remove the water drops deposited on the wafer by the centrifugal force of the rotation and the IPA vapor drying method in which the wafer is dried through the substitution of volatile isopropyl alcohol (IPA) on the moisture deposited on the wafer. Then, after the completion of such drying processing, the wafer is transported by such transfer means as a robot hand to a heat treatment equipment or epitaxial growth equipment which performs the processing of the next processing step.

However, the moisture on the wafer cannot be removed completely even with the cleaning of the conventional semiconductor wafer manufacturing apparatus. Particularly, where a protective oxide film is formed on the wafer surface, there is a problem that the deposited moisture cannot be removed completely by the spin cleaning method due to the wafer surface being hydropholic.

Further, the wafer surface following the completion of the final cleaning processing is in such condition that there is the adsorption of oxygen atoms, oxygen molecules, water molecules, etc., in addition to the water drops. As a result, there is the disadvantage that only with such drying processing as the spin drying method or the IPA vapor drying method used in the conventional semiconductor wafer manufacturing apparatus, it will be possible to remove the water drops from the wafer but the adsorbed oxygen atoms, oxygen molecules, water molecules, etc., cannot be additionally removed completely.

Also, there is another disadvantage that the drying processing is effected within the cleaning chamber where the atmosphere contains much water so that the moisture in the atmosphere as well as the moisture once removed from the wafer are again deposited on the wafer thus making it impossible to remove the moisture completely from the wafer. Thus, in the case of the conventional semiconductor wafer manufacturing apparatus, there is the disadvantage that even if the drying processing is effected after the completion of the final cleaning processing, the moisture, oxygen atoms, oxygen molecules, etc., are still left on the wafer. As a result, there is the disadvantage that such remaining moisture, etc., tend to cause and bring about the occurrence of crystal defects or the deterioration in the film quality of an epitaxial layer in the heat treatment processing or the epitaxiak growth processing of the following processing step.

It is conceivable to perform the drying processing within the cleaning chamber over a long period of time with a view to completely removing the oxygen atoms, oxygen molecules, water molecules, etc., which are adsorbed onto the wafer. In this case, however, the overall time required for semiconductor wafer manufacturing purposes will be increased in correspondence to the drying time.

Further, while it is also conceivable to perform a processing operation of removing the moisture, etc., on the wafer surface in the epitaxial growth furnace, diffusion furnace or the like used in the processing of the following processing step and substituting the atmosphere gas containing them, this substitution of such atmosphere gas also requires much time. Thus, there is the disadvantage that either of these cases causes deterioration of the efficiency of the semiconductor wafer manufacturing process.

Still further, it is conceivable to use a method of newly providing a separate drying chamber in addition to the cleaning chamber so as to prevent the atmosphere in the drying chamber from containing any moisture and thereby to dry the semiconductor wafer. In this case, however, an additional processing step of transferring the wafer from the cleaning chamber to the drying chamber is required and the overall processing time for semiconductor wafer manufacturing purposes is increased in correspondence to such processing, thus failing to overcome the disadvantage that semiconductor wafers cannot be produced efficiently. In addition, there is the disadvantage that the provision of the additional drying chamber makes the apparatus excessively large. Particularly, in recent years, manufacturing apparatus for large-diameter semiconductor wafers of the 400 mm class in diameter, which are now on trial manufacture, tend to become excessively large corresponding to the large diameter and therefore a more compact apparatus is desired.

DISCLOSURE OF INVENTION

In view of the foregoing deficiencies, it is the primary object of the present invention to provide an apparatus for manufacturing a semiconductor wafer, which is capable of removing effectively the moisture, etc., deposited on a semiconductor wafer subjected to a final cleaning processing, so as to produce the semiconductor wafer which is free from the occurrence of crystal defects and high in quality. Also, it is another object of the present invention to provide an apparatus for manufacturing a semiconductor wafer, which is so designed that the manufacturing time of a semiconductor wafer can be reduced to thereby produce the semiconductor wafer efficiently. It is still another object of the present invention to provide an apparatus for manufacturing a semiconductor wafer so designed that the apparatus can be made more compact while ensuring the complete removing of moisture even in the case of large-diameter semiconductor wafers.

In accordance with a preferred aspect of the present invention, there is provided a semiconductor wafer manufacturing apparatus comprising:

a cleaning equipment for performing a final cleaning processing preceding a heat processing on a semiconductor wafer substrate cut from a semiconductor single crystal;

chamber means adapted to receive said wafer substrate after the completion of said final cleaning processing, for the purpose of waiting for or performing said heat processing on said wafer substrate;

a transfer chamber communicating with said cleaning equipment and said chamber means, respectively;

transfer means for transporting said wafer substrate after the completion of said final cleaning processing from said cleaning equipment to said chamber means within said transfer chamber;

heating means for heating said wafer substrate in course of transfer within said transfer chamber to a predetermined temperature; and gas supply means for injecting an inert gas in the form of a laminar flow onto said wafer substrate in course of transportation within said transfer chamber in a direction tending toward said cleaning equipment side from said chamber means side of said transfer chamber.

According to the present invention, within the transfer chamber, the semiconductor wafer substrate is heated to the given temperature while being transported to the chamber means so that even after a processing such as a spin drying or IPA vapor drying has been effected within the cleaning equipment following the completion of the final cleaning processing on the wafer sustrate, a drying processing due to the heating of the wafer substrate while being transported to the chamber means is continuously performed within the transfer chamber. As a result, the drying processing over an elongated period of time as compared with the conventional semiconductor wafer manufacturing apparatus is performed so that the moisture, oxygen atoms, water molecules, oxygen molecules, etc., deposited on the wafer substrate can be completely vaporized and removed.

Further, in the case of the present invention, it is suffice that the drying processing such as the spin drying or the IPA vapor drying within the cleaning equipment is effected for the same period of time as the conventional apparatus and thereafter the drying processing due to the heating is performed during the transportation of the wafer within the transfer chamber. Thus, in contrast to the conventional apparatus in which the drying time within the cleaning equipment must be increased so as to improve the removing effect of the moisture on the wafer, the overall time of the semiconductor wafer manufacturing process can be reduced thus making it possible to effect an efficient manufacture of semiconductor wafers.

Still further, there is no need to additionally provide a new drying chamber or the like for wafer drying purposes so that the construction of the apparatus on the whole can be made more compact and it is particularly suited as a manufacturing apparatus for large-diameter semiconductor wafers which tend to become excessive bulky. Thus, according to the present invention, the moisture, etc., deposited on a semiconductor wafer after the completion of a final cleaning processing can be removed completely while realizing a reduced manufacturing time and a compact construction for the apparatus.

The chamber means receives the wafer substrate which has been already subjected to the final cleaning processing for the purpose of waiting for or performing the heat processing on said wafer substrate. In this context, "the heat processing on the wafer substrate after the completion of the final cleaning processing" includes not only an actual process of a heat treatment after the completion of the final cleaning processing, e.g., an epitaxial growth processing, a CVD growth processing, an annealing processing or a thermal diffusion processing but also a storage operation for storing the wafer substrate after the completion of the final cleaning processing in the preceding temporal wait period to such actual heat treatment processing.

Also, the term "chamber means" corresponds, for example, to a furnace chamber of a heat treating furnace such as an epitaxial growth furnace, a CVD furnace or an anneal furnace when the wfer substrate is to be directly subjected to the heat treatment, or to a wafer storage chamber for storing a plurality of wafer substrates after the final cleaning on a multi-shelf cassette when the wafer substrate is to be stood for the preceding temporal wait period to the actual heat treatment.

Where it is constructed so that an epitaxial growth furnace is used for the heat processing and the wafer substrate after the completion of the final cleaning processing is heated during its transportation to the epitaxial growth furnace, the wafer substrate can be pre-heated during its transportation. In other words, while, prior to the performance of the epitaxial growth processing, the interior of the epitaxial growth furnace has been generally heated preliminarily to a pre-heat temperature of from 700 to 800° C., according to the present invention the wafer substrate can be preliminarily heated to a given temperature during its transportation by the heating means assembled to the transfer chamber. As a result, there is the advantage of preventing the occurrence of cracks, etc., in the wafer substrate due to a rapid temperature change when it is transported into the epitaxial growth furnace.

It is to be noted that the transfer means in the present invention is not limited to any particular type provided that the wafer substrate can be transported within the transfer chamber, as for example, it is possible to use a robot hand, end effector or the like which holds the semiconductor wafer substrate. In this case, the robot hand is exposed to the heating temperature within the transfer chamber or it holds the wafer substrate directly so that it should preferably be made from quartz which is excellent in heat resistance and high in cleanness.

In the present invention, the heating means, which is to be assembled to the transfer chamber, is not limited in construction particularly provided that it is capable of heating the semiconductor wafer substrate being transported within the transfer chamber to a given temperature. For example, it is possible for the heating means to construct so that infrared lamps, heaters or the like are disposed as the heating means on the outside of the transfer chamber to heat the semiconductor wafer substrate from the outside of the transfer chamber. In this case, any ill effect of the inert gas, etc., on the infrared lamps or the like can be prevented. Note that in this case, the wall of the transfer chamber should preferably be made from quartz which is excellent in heat resistance.

Also, a heater or the like which is embedded in the transfer means such as a robot hand or an end effector can for example be used as the heating means. In this case, the semiconductor wafer substrate is heated from nearby and thus there is the advantage of effectively performing the drying processing due to the heating.

In addition, it is possible to use as the heating means a hot air nozzle(s) or the like which is provided in the transfer path of the wafer sustrate within the transfer chamber to blow hot air against the wafer substrate being transported to heat it. In this case, the wafer substrate can be heated while keeping the removed moisture, etc., away from it by the blown hot air and thus there is the advantage of more effectively preventing any redeposition of the moisture, etc., on the wafer substrate.

Further, the heating means may be provided with temperature adjusting means for adjusting or controlling the heating temperature for the semiconductor wafer substrate which is being transported within the transfer chamber. In this case, the heating temperature for the semiconductor wafer substrate can be adjusted or controlled in any conventional manner with the temperature adjusting means so that in accordance with the amount of the moisture deposited on the semiconductor wafer substrate, the distance of the transfer path, etc., it is possible to vary the heating temperature in a stepwise or continuous manner or set the heating temperature arbitrarily at the desired temperature so as to make the processing of the semiconductor wafer manufacturing more effective. An SCR controller, PID controller or the like may for example be used for such temperature adjusting or controlling.

While there is no limitation to the heating temperature of the semiconductor wafer substrate by the heating means, it should preferably be as such that the moisture deposited on the semiconductor wafer substrate after the final cleaning can be completely removed, e.g., in the range between 100° C. and 200° C. The reason is that the wafer drying efficiency will be deteriorated in the case of lower temperature than 100° C., whereas there is the danger of causing a reaction between the moisture and the wafer substrate and growing a silicon oxide layer in the case of higher temperature than 200° C., thus, these problems must be prevented.

Still further, according to the present invention the gas supply means supplies an inert gas in the form of a laminar flow to the semiconductor wafer substrate being transported within the transfer chamber in a direction tending from the chamber means side to the cleaning equipment side of the transfer chamber. Here, the term "laminar flow" means that the supplied inert gas flows at a constant velocity without being convected within the transfer chamber and the laminar flow state of the inert gas can be obtained by decreasing the height of the transverse sectional area of the transfer chamber to as small as not causing any convection or providing two plate members above and below the transfer path of the semiconductor wafer substrate so as to decrease its width. Then, the inert gas in this laminar flow form flows in the direction tending from the chamber means side to the cleaning equipment side or in a direction opposing the semiconductor wafer substrate being transported thus preventing any gas flow from entering from the cleaning equipment side. Also, not only the moisture, etc., removed by the heating means can be purged by the inert gas, but also the moisture, etc., can be rapidly kept away from the semiconductor wafer substrate by the jet stream of the inert gas, thus preventing the redeposition of the moisture, etc., and the deposition of other contaminants on the wafer surface and thereby improving the cleanness of the semiconductor wafer substrate.

As, for example, nitrogen, argon or the like can be used as such inert gas.

Here, the transfer chamber in the present invention is a space for movement of the wafer substrate and it is not particularly limited in construction provided that it is communicated with the chamber means and the processing equipment, respectively. In order to prevent the deposition on the wafer of contaminants from the outside, however, the transfer chamber should preferably be shut off from the outside except its portions communicating with the cleaning equipment and the chamber means.

The gas supply means in the present invention is not limited particularly in construction provided that it supplies an inert gas in the form of a laminar flow to the semiconductor wafer substrate being transported within the transfer chamber in a direction tending from the chamber means side to the cleaning equipment side. In order to provide such gas supply means, it is possible to construct so that the inert gas of a high flow velocity is injected into the transfer chamber having the height of itself reduced or having the plate members adjoining the sides of the wafer disposed in the transfer path as mentioned previously. In this case, there is the advantage of easily causing the inert gas to take the form of a laminar flow within the transfer chamber.

Also, as regard the location of mounting for the gas supply means, it can be either the inside or the outside of the transfer chamber. For instance, the gas supply means can be disposed inside the chamber means or above-mentioned furnace chamber.

According to a preferred embodiment of the present invention, the transfer chamber is formed with at least one quartz window adapted for heat conduction from the outside, and the heating means includes at least one heat source which is disposed outside the transfer chamber and arranged at a position corresponding to the window.

In this embodiment, the heating means includes the heat source arranged at the position corresponding to the quartz window which is provided on the transfer chamber and capable of conducting heat. Here, the term "position corresponding to the window" means such position at which the interior of the transfer chamber can be heated from its outside through the window so that where the window is provided in the upper wall of the transfer chamber, the corresponding position is the adjacent position above the window. Also, infrared lamps, a heater or the like is suitable for the heat source.

In this case, the interior of the transfer chamber is heated from the heat source of the heating means through the quartz window of the transfer chamber as mentioned previously so that the transfer chamber is heated while maintaining its shut-off condition from the outside and thus the deposition of external contaminants on the wafer surface in course of transfer can be prevented.

Further, the window of the transfer chamber is capable of heat conduction and thus the wafer substrate being transported can be heated from outside the transfer chamber without deteriorating the heating effect on the interior of the transfer chamber. Still further, the window is made from quartz which is excellent in heat resistance and thus the window can be prevented from being thermally deformed or broken due to the heating.

In the present invention, the window is not particularly limited in construction provided that it is constructed so that the heat source of the heating means can heat the interior of the transfer chamber from its outside. For example, in addition to providing the quartz window only at the position corresponding to the position of the heat source, the whole areas of the upper and lower walls of the transfer chamber can be formed into quartz windows. In this case, there is the advantage of eliminating any limitation to the arrangement of the heat sources.

According to another preferred embodiment of the present invention, the apparatus further comprises exhaust means for exhausting the moisture removed from the semiconductor wafer substrate.

In this case, the moisture removed from the semiconductor wafer substrate is exhausted by the exhaust means so that the moisture evaporated from the wafer surface due to the heating by the heating means is exhausted to the outside of the transfer chamber by the exhaust means. As a result, the moisture once removed from the wafer substrate by the heating means can be prevented from being deposited again on the wafer surface thereby further improving the cleanness of the wafer substrate.

In the present invention, the exhaust means is not particularly limited in construction provided that it can exhaust the moisture removed from the wafer substrate. For instance, it is possible to provide, as the exhaust means, a unit which employs a vacuum pump so as to rapidly suck and exhaust the moisture. Also, the exhaust means should preferably be disposed on the cleaning equipment side within the transfer chamber or inside the chamber of the cleaning equipment.

The above and other features and advantages of the present invention will become more apparent from the following description of a preferred embodiment shown simply for illustrative purposes without any intention of limitation when taken in conjunction with the accompanying drawings.

BEST MODE FOR CARRYING OUT THE INVENTION

Figure 1:
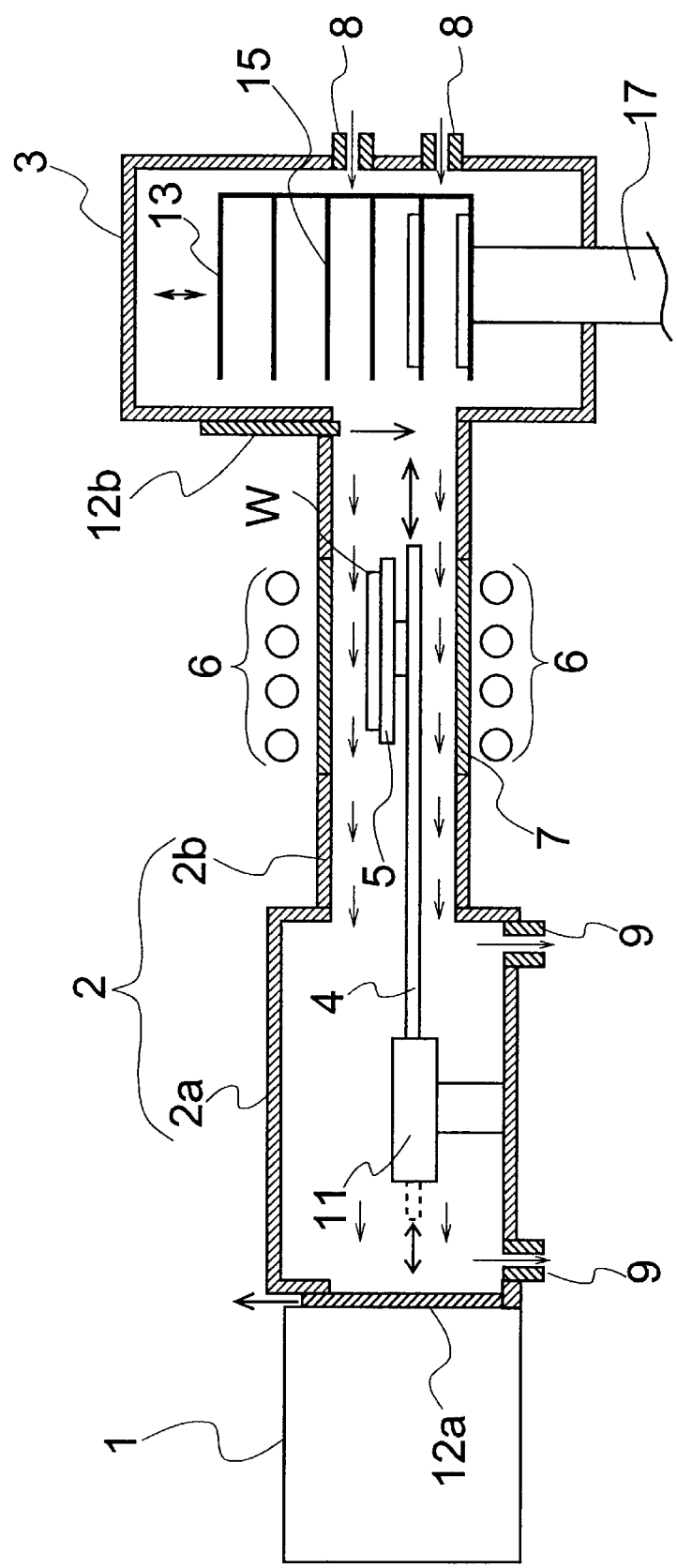
FIG. 1 is a sectional view showing the schematic construction of a silicon wafer manufacturing apparatus according to an embodiment of the present invention.
Figure 2:
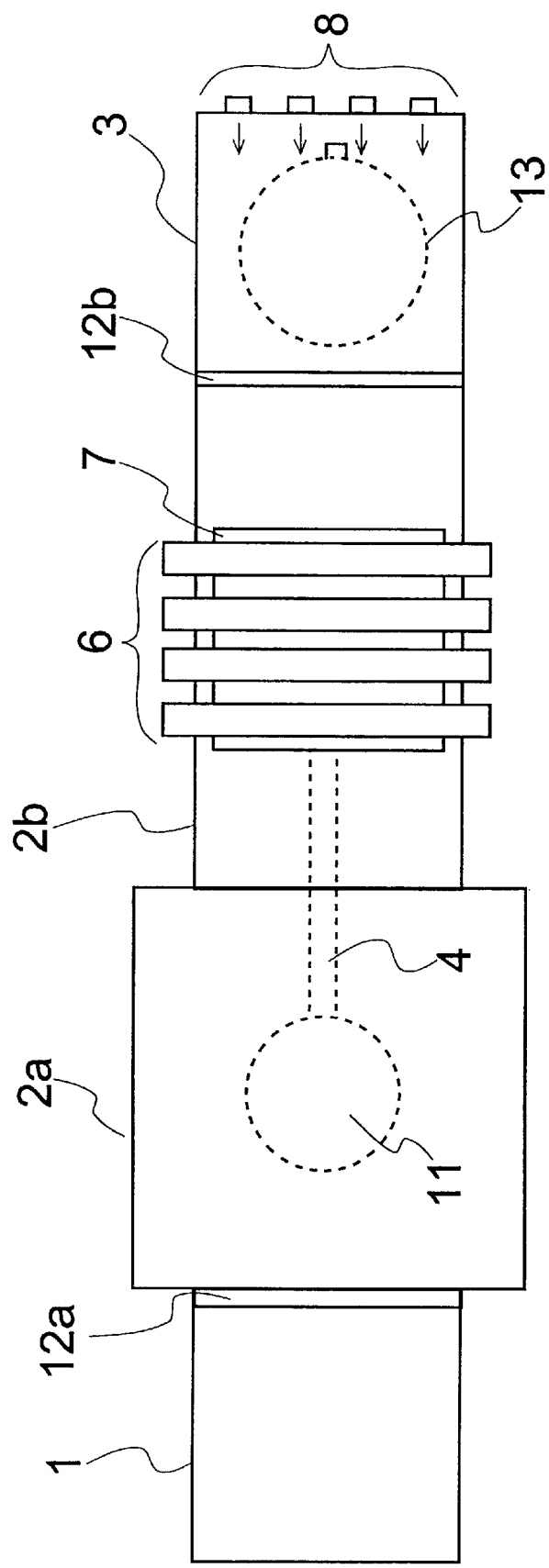
FIG. 2 is a plan view showing the schematic construction of the silicon wafer manufacturing apparatus according to the embodiment as shown in FIG. 1.

A silicon wafer manufacturing apparatus according to the present embodiment mainly includes, as shown in FIGS. 1 and 2, a cleaning equipment 1, a transfer chamber 2 and a wafer storage chamber 3.

The cleaning equipment 1 is an equipment in which a silicon wafer substrate W which has undergone various preceding steps including the removal of a surface oxide film, polishing, etc., is subjected to a final cleaning processing by the DHF cleaning method using ozone ultrapure water and then the silicon wafer substrate W after the completion of the cleaning processing is subjected to a drying processing by the spin drying method. The cleaning equipment 1 is composed of a cleaning chamber, an in-equipment gas substitution unit (not shown) by an inert gas disposed inside the cleaning chamber, etc.

The wafer storage chamber 3, which constitutes the chamber means of the present invention, includes an elevator shaft 17 in its lower part and a multi-shelf carrier 13 detachably mounted on the upper end of the elevator shaft 17. The carrier 13 includes a plurality of shelves 15 forming a multi-shelf structure vertically. Also, the wafer storage chamber 3 is communicated with the transfer chamber 2 through an opening which permits a robot arm 4, a robot hand 5 and the wafer substrate W held by the hand 5 to pass therethrough and each of the shelves 15 of the multi-shelf carrier 13 is opened on the front side which faces the opening. In addition, each of the shelves 15 can be separately caused to face the opening through the vertical movement of the elevator shaft 17.

Formed in the wall portion of the wafer storage chamber 3 which is opposite to the transfer chamber 2 are a plurality of gas injector ports 8 for injecting and supplying an inert gas such as nitrogen or argon into the wafer storage chamber 3 and the transfer chamber 2. Each of the injector ports 8 is connected through a piping to an inert gas supply unit which is not shown and the gas flow rate and gas pressure are adjusted by a mass flow meter and pressure control unit. The injector ports 8 and the inert gas supply unit constitute the gas supply means of the present invention.

The transfer chamber 2 is a space for movement for the wafer substrate W so that the silicon wafer substrate W is transported from the cleaning equipment 1 to the wafer storage chamber 3, and the transfer chamber 2 is composed of a storage sub-chamber 2a for storing a four-screw robot 11 and a transfer path 2b leading to the wafer storage chamber 3. Disposed inside the transfer chamber 2 are the robot hand 5 holding the silicon wafer substrate W and the robot arm 4 whereby the silicon wafer substrate W held by the robot hand 5 is moved between the interior of the cleaning equipment 1 and the multi-shelf carrier 13 inside the wafer storage chamber 3. Due to the fact that the robot hand 5 and the robot arm 4 are placed under a heating environment and that contamination of wafers must be prevented, they are made from quartz which is excellent in heat resistance and cleanness. The movement of the robot arm 4 is controlled by the four-axis robot 11 disposed in the storage chamber 2a. The robot hand 5, the robot arm 4 and the four-axis robot 11 constitute the transfer means of the present invention.

Also, the transfer chamber 2 includes therein a gate 12a disposed so as to define a boundary between the storage sub-chamber 2a and the cleaning chamber 1 and adapted for opening and closing and a gate 12b disposed so as to define a boundary between the transfer path 2b and the wafer storage chamber 3 and adapted for opening and closing. Thus, when the gates 12a and 12b are opened, the transfer chamber 2 (the storage sub-chamber 2a) is communicated with the cleaning equipment 1 and the transfer chamber 2 (the transfer path 2b) is communicated with the wafer storage chamber 3, respectively, thus permitting the transportation of the silicon wafer substrate W held on the robot hand 5 to the wafer storage chamber 3 by the robot arm 4.

The transfer path 2b is so constructed that it is low in height and its height is about 30 mm in the present embodiment. As a result, the inert gas injected from the gas injector ports 8 is not convected but it flows in the form of a laminar flow in the transfer path 2b. Note that the height of the transfer path 2b is not limited to about 30 mm and it can be designed to have any arbitrary height provided that the laminar flow state of the inert gas is maintained.

Four infrared lamps 6 are arranged on each of the upper and lower sides of the transfer path 2b for the purpose of heating its interior from the outside of the transfer chamber 2. The infrared lamps 6 constitute the heating means and the heat sources of the present invention.

In addition, two windows 7 of substantially rectangular shape are respectively formed in the upper and lower surfaces of the transfer path 2b in correspondence to the positions where the infrared lamps 6 are arranged. The windows 7 are made from high-purity transparent quartz in consideration of the heat resistance. Thus, the silicon wafer substrate W in course of transfer within the transfer path 2b is heated by the the upper and lower infrared lamps 6 through the windows 7. Note that the interior of the transfer path 2b is heated up to about 100° C. to 200° C. by the infrared lamps 6. In the case of lower temperatur than 100° C., the drying efficiency of wafers is deteriorated, whereas in the case of higher temperature than 200° C., the moisture reacts with the wafer substrate to form a silicon oxide film thereon, thus making it necessary to prevent these deficiencies.

Formed in the lower part of the storage sub-chamber 2a are a plurality of gas vent ports 9 for externally exhausting the inert gas flowing through the transfer chamber 2. Connected by piping to the ports 9 is a vent control unit which is not shown so that the gas within the transfer chamber 2 is sucked and exhausted through the gas vent ports 9 under the control of the vent control unit. The gas vent ports 9 and the vent control unit constitute the exhaust means of the present invention.

A silicon wafer manufacturing method utilizing the apparatus of the present embodiment constructed as described hereinabove will now be described in a time sequential manner.

Firstly, a silicon wafer substrate W which has preliminarily undergone such preceding steps as polishing, etc., is transferred into the cleaning equipment 1 and the gate 12a is closed. A final cleaning processing is performed on the silicon wafer substrate W within the cleaning equipment 1 according to a prescribed method. Then, the silicon wafer substrate W subjected to the final cleaning processing is rotated at a high velocity for a fixed time at a given position in the cleaning equipment 1 thereby performing a mechanical drying processing of causing the water drops deposited on the wafer substrate W to scatter and removing them. When the drying processing is completed, the gates 12a and 12b are opened.

Then, the robot hand 5 is moved to a prescribed position within the cleaning equipment 1 by the robot arm 4 and the silicon wafer substrate W subjected to the final cleaning processing is held by the robot hand 5. Then, the silicon wafer substrate W held on the robot hand 5 is transported into the storage sub-chamber 2a from the cleaning equipment 1 and thereafter the gate 12a is closed. Then, the introduction of an inert gas from the injector ports 8 and the suction and exhaustion of the inert gas through the gas vent ports 9 are started. As a result, there is produced a gas stream or a laminar flow of the inert gas within the transfer chamber 2 (the storage sub-chamber 2a and the transfer path 2b) tending toward the gas vent ports 9 from the injector ports 8.

Next, the silicon wafer substrate W held by the robot hand 5 is moved as such into the transfer path 2b and transported toward the wafer storage chamber 3 by the robot arm 4. At this time, the interior of the transfer path 2b has been heated up to about 100° C. to 200° C. by the infrared lamps 6 so that the moisture remaining on the wafer substrate surface and the oxygen atoms, oxygen molecules, water molecules, etc., adsorbed on the wafer substrate surface are evaporated due to the heating from the infrared lamps 6 during the transportation of the wafer substrate W, thereby completely removing the moisture, etc., which have not been removed by only the drying processing within the cleaning equipment 1. Also, the inert gas is always flowing as a laminar flow in the opposite direction to the normal transportation direction within the transfer path 2b and therefore the moisture, etc., evaporated from the wafer substrate W are kept away from the wafer substrate W by the gas stream of the inert gas.

Then, the moisture, etc., are rapidly moved into the storage chamber and sucked and exhausted through the gas vent ports 9, thereby purging the interior of the transfer chamber 2 by the inert gas. Therefore, the moisture, etc., on the wafer substrate W, the oxygen atoms, oxygen molecules, water molecules, etc., adsorbed on the wafer substrate W, once removed, can be prevented from redepositing on the wafer substrate W and can be completely removed.

When the wafer substrate W is transported to near the wafer storage chamber 3, the empty shelf 15 of the multi-shelf carrier is moved to the opposing position to the gate 12b through the vertical movement of the elevator shaft 17 in the wafer storage chamber 3. Then, the wafer substrate W is transferred to the empty shelf 15 by the robot arm 4 and it is placed on the shelf 15 by the robot hand 5. Thereafter, the robot hand 5 from which the wafer substrate W has been removed is returned into the storage sub-chamber 2a and the gate 12b is closed. At this time, the final cleaning processing of the next silicon wafer substrate is being performed in the cleaning equipment 1. After the final cleaning of the next silicon wafer substrate has been completed, the robot hand 5 and the robot arm 4 are moved into the cleaning equipment 1. Then, the various processings of transferring a silicon wafer substrate to the multi-shelf carrier 13 in the wafer storage chamber 3 from the cleaning equipment 1, heating the wafer substrate being transferred and storing It in the multi-shelf carrier 13 are repeatedly performed in the same manner as mentioned previously until the silicon wafer substrates are stored on all of the shelves 15 of the multi-shelf carrier 13.

Thus, in accordance with the silicon wafer manufacturing apparatus of the present embodiment, the moisture, oxygen atoms, oxygen molecules and water molecules deposited on a silicon wafer substrate W are completely removed by heating it by the infrared lamps 6 during its transportation from the cleaning equipment 1 to the wafer storage chamber 3. Therefore, the occurrence of crystal defects, etc., due to the deposited moisture, etc., during the following heat treatment processing can be prevented.

While, in the silicon wafer manufacturing apparatus of the present embodiment, a wafer substrate is transported from the cleaning equipment 1 to the wafer storage chamber 3, it is possible to construct so that the wafer substrate is directly transported to an epitaxial growth furnace. In this case, the wafer substrate is heated to about 100° C. to 200° C. during its transfer to the epitaxial growth furnace so that the wafer substrate subjected to a preheating in addition to the drying processing is transported into the epitaxial growth furnace under the preheating temperature. Thus, the occurrence of a thermal deformation, etc., in the wafer substrate due to rapid temperature changes can be prevented thereby producing a high-quality epitaxial wafer. Also, owing to the heating of a wafer substrate during its transfer, the drying processing in the cleaning equipment 1 as well as the preheating processing in the epitaxial growth furnace can be performed efficiently thereby improving the silicon wafer manufacturing efficiency.

While, in the silicon wafer manufacturing apparatus according to the present embodiment, the infrared lamps 6 disposed outside the transfer chamber as the heating means and the heat sources are used, it is possible to mount a heater in the robot hand 5 so as to use it as heating means or a heat source. In this case, a wafer substrate is heated in the vicinity of the heater so that the drying processing can be performed more efficiently during the transportation of the wafer substrate.

While, in the present embodiment, the gas injector ports 8 are disposed in the wafer storage chamber 3 and the gas vent ports 9 are disposed in the storage sub-chamber 2a, it is possible to a dispose the gas injection ports 8 on the wafer storage chamber 3 side of the transfer path 2b and also dispose the gas vent ports 9 on the storage sub-chamber 2a side of the transfer path 2b. In other words, it is arbitrary to dispose these ports at any desired places provided that the gas stream within the transfer path takes the form of a laminar flow.

What is claimed is:

1. An apparatus for manufacturing a semiconductor wafer, comprising:

a cleaning equipment for performing a final cleaning processing preceding a heat processing on a semiconductor wafer substrate cut from a semiconductor single crystal;

chamber means adapted to receive said wafer substrate after the completion of said final cleaning processing, for the purpose of waiting for or performing said heat processing on said wafer substrate;

a transfer chamber communicating with said cleaning equipment and said chamber means, respectively;

transfer means for transporting said wafer substrate after the completion of said final cleaning processing from said cleaning equipment to said chamber means within said transfer chamber;

heating means for heating said wafer substrate in course of transfer within said transfer chamber to a predetermined temperature; and gas supply means for injecting an inert gas in the form of a laminar flow onto said wafer substrate in course of transportation within said transfer chamber in a direction tending toward said cleaning equipment side from said chamber means side of said transfer chamber.

2. An apparatus according to claim 1, wherein said transfer chamber includes at least one quartz window adapted for conducting heat externally, and wherein said heating means includes at least one heat source arranged at a position corresponding to said window on the outside of said transfer chamber.

3. An apparatus according to claim 1, further comprising exhaust means for exhausting moisture removed from said semiconductor wafer substrate.

* * * * *